(12) United States Patent
Tofano

(10) Patent No.: US 8,543,551 B2
(45) Date of Patent: Sep. 24, 2013

(54) COLLABORATIVE, DISTRIBUTED, DATA DE-DUPLICATION

(76) Inventor: Jeffrey Vincent Tofano, San Jose, CA (US)

( * ) Notice: Subject to any disclaimer, the term of this patent is extended or adjusted under 35 U.S.C. 154(b) by 95 days.

(21) Appl. No.: 13/182,498

(22) Filed: Jul. 14, 2011

(65) Prior Publication Data

US 2012/0016852 A1 Jan. 19, 2012

(51) Int. Cl.
*G06F 7/00* (2006.01)
*G06F 17/00* (2006.01)

(52) U.S. Cl.
CPC . *G06F 7/00* (2013.01); *G06F 17/00* (2013.01)
USPC .............................. 707/687; 707/694; 707/698

(58) Field of Classification Search
None
See application file for complete search history.

(56) References Cited

U.S. PATENT DOCUMENTS

| 8,171,253 B2 * | 5/2012 | Narayanasamy | 711/203 |
| 2010/0058013 A1 * | 3/2010 | Gelson et al. | 711/162 |
| 2010/0082558 A1 * | 4/2010 | Anglin et al. | 707/694 |
| 2011/0138154 A1 * | 6/2011 | Tevis et al. | 712/220 |

* cited by examiner

*Primary Examiner* — Jay Morrison

(57) ABSTRACT

Example apparatus, methods, and computers participate in collaborative, distributed, data de-duplication. One example method includes initializing a layered parser in a first node in a collaborative distributed data de-duplication (CDDD) topology with a first set of de-duplication control parameters. After transmitting some information to another node in the CDDD topology, the method includes selectively reconfiguring the layered parser in response to feedback acquired from the second node in the CDDD topology. The feedback concerns the data provided by the layered parser.

19 Claims, 6 Drawing Sheets

COLLABORATIVE, DISTRIBUTED, DATA DE-DUPLICATION

CROSS REFERENCE TO RELATED APPLICATION

This application claims priority to United Kingdom Patent Application No. 1012108.5 filed on Jul. 19, 2010, the disclosure of which is incorporated herein by reference in its entirety.

BACKGROUND

Connections between computers are becoming ubiquitous. Therefore, interesting ways to have computers interact and participate in shared tasks are becoming more ubiquitous. One area in which computers are increasingly communicating and co-operating involves data de-duplication.

De-duplication can involve chunking, hashing, and indexing an object. When there are multiple computers involved in de-duplication, then multiple computers may be involved in the chunking, hashing, and indexing. The multiple computers may communicate raw data, chunked data, and hashes associated with chunked data, among other things.

Since different computers may have been configured differently, and since different computer configurations may have evolved over time, the multiple computers involved in a shared action may be operating according to different rules concerning how to chunk, hash, and/or index data. Since different computers may have participated in different communications and different actions, different data may be indexed and/or available at the different computers.

Both communications bandwidth and memory can be saved by not re-communicating raw data between computers that already have indexed, de-duplicated copies of the raw data. However, when the multiple computers have operated under different rules, conventionally it may have been difficult, if even possible at all, for the multiple computers to realize that they all had de-duplicated copies of the raw data. Even if the multiple computers agreed on some standard or minimal chunk size for communicating raw data, unnecessary communications may have occurred since the standard or minimal chunk size was likely not the most efficient chunk size available. Inefficient and/or mismatched chunk sizes persist in conventional systems because multiple computers conventionally have not negotiated an efficient and/or matching chunk size. Additionally, even if the multiple computers agreed on communicating some mixture of raw data and hashes associated with raw data to transmit, unnecessary communications may still have occurred once again due to efficiencies and consistencies not being negotiated.

BRIEF DESCRIPTION OF THE DRAWINGS

The accompanying drawings, which are incorporated in and constitute a part of the specification, illustrate various example methods, apparatuses, and other example embodiments of various aspects of the invention described herein. It will be appreciated that the illustrated element boundaries (e.g., boxes, groups of boxes, other shapes) in the figures represent one example of the boundaries of the elements. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
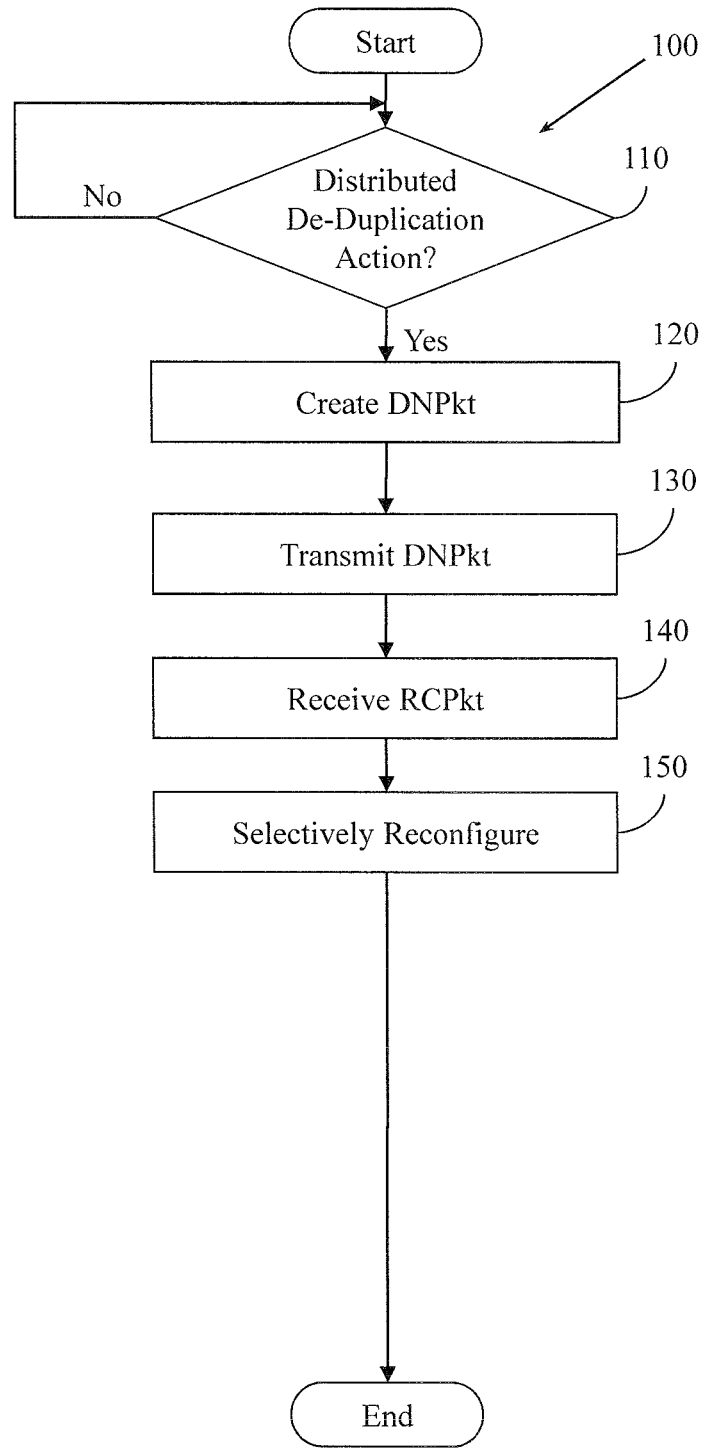
FIG. 1 illustrates an embodiment of a method associated with collaborative distributed data de-duplication.

Example apparatus and methods facilitate negotiating efficient, consistent, and appropriate chunk sizes for communications between collaborating, distributed, data de-duplication (CDDD) processes and apparatuses. Example apparatus and methods also facilitate negotiating efficient and appropriate mixtures of raw data and hashes to communicate between processes and apparatuses working together in a CDDD topology. Rather than employing an over-arching, centralized control approach, example apparatus and methods employ a parameterized reactive agent that controls chunking, hashing, indexing, and transmission properties of a participating apparatus or process. The parameterized reactive agent can be configured with an initial set of parameters, perform an initial communication with a collaborating apparatus or process, and then be reconfigured based on feedback from the collaborating apparatus or process. This facilitates individualizing communications between different sets of collaborators in real-time based on existing conditions, which in turn facilitates achieving efficiencies and consistencies unavailable to conventional systems. In one embodiment, the negotiations between members of a collaborating set can occur on-demand, and just-in-time for a collaboration.

The following includes definitions of selected terms employed herein. The definitions include various examples and/or forms of components that fall within the scope of a term and that may be used for implementation. The examples are not intended to be limiting.

References to "one embodiment", "an embodiment", "one example", "an example", and other similar terms indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" or "in one example" does not necessarily refer to the same embodiment or example.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations include physical manipulations of physical quantities. Usually, though not necessarily, the physical quantities take the form of electrical or magnetic signals capable of being stored, transferred, combined, compared, and otherwise manipulated in a logic. The physical manipulations transform electronic components and/or data representing physical entities from one state to another.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

FIG. 1 illustrates a method 100. At 110, method 100 determines whether a first node configured with a parameterized reactive agent is going to participate in a collaborative, distributed data de-duplication operation in a collaborative, distributed, data de-duplication (CDDD) topology. If the node is not about to participate in a collaborative, distributed data de-duplication operation in a CDDD topology, then method 100 may wait until the node does so. If the node is about to participate, then method 100 proceeds to 120. In one example, determining that the first node is going to participate in the collaborative, distributed, data de-duplication operation is performed on-the-fly, just-in-time, during collaborative de-duplication actions involving two or more nodes in the CDDD topology. For example, when a node in the CDDD topology receives a request from another node concerning taking concerted action, the determination may be made. In another example, when some raw data is received, the first node may determine whether the raw data can be de-duplicated using the CDDD topology and thus the determination may be made.

The parameterized reactive agent at the first node may be configured to control the first node to perform several actions in accordance with the set of parameters. The actions can include producing a chunk of raw data from the raw data available at the first node, producing a hash of the chunk of raw data, indexing the chunk based on the hash, transmitting the chunk to the second node, and transmitting the hash to the second node.

At 120, method 100 includes controlling the first node, in accordance with a set of parameters associated with the parameterized reactive agent, to create a de-duplication negotiation packet (DNPkt) associated with processing raw data available to the first node. A DNPkt includes information that allows a receiver of the DNPkt to evaluate the provider of the data and the data received. A DNPkt can include a portion of the raw data. A first DNPkt may include a first amount of raw data while a subsequent DNPkt may include a second amount of raw data. A DNPkt can also include a hash of the portion of the raw data. In one embodiment the hash may be a strong, wide hash suitable for uniquely identifying a chunk of data. In another embodiment the hash may be a weaker, narrower hash suitable for making a non-deterministic similarity determination. In one embodiment, a DNPkt can include multiple hashes for a packet. The multiple hashes may be computed different ways and have different strengths and widths.

A DNPkt may also include context data associated with the raw data. Raw data is not processed in a vacuum. Information about the raw data may be available. For example, the context data may identify a file type associated with the raw data, whether the raw data has been previously de-duplicated, a source associated with the raw data, a destination associated with the raw data, whether the data is associated with a replication event, whether the raw data is associated with a rule for parsing data, and whether the raw data is associated with configuring a layered parser.

The parameterized reactive agent may take advantage of this available context data. For example, the set of parameters may be determined based, at least in part, on the context data. Additionally and/or alternatively, the composition of the DNPkt may be determined, at least in part, by the context data. While a single piece of raw data and a single hash have been described, one skilled in the art will appreciate that in different embodiments a DNPkt may include multiple portions of raw data and multiple hashes. Furthermore, the multiple portions may be different lengths and may be the result of different types of partitioning (e.g., fixed length, variable length, delimiter based).

At 130, method 100 includes controlling the first node to transmit the DNPkt to a second node in the CDDD topology. One skilled in the art will appreciate that the DNPkt may be transmitted to one or more second nodes in the CDDD. Sending the DNPkt to multiple nodes facilitates identifying nodes that are available and appropriate for a shared de-duplication action. The DNPkt is sent out when a collaborative action is desired because processing loads and amounts of memory/storage available can vary over time and thus which node(s) are available and appropriate can vary.

At 140, method 100 includes receiving, from the second node(s), a reactive control packet (RCPkt) responsive to the DNPkt. In one example, an RCPkt includes information identifying a desired de-duplication node for the raw data. This information may be used to control whether raw data will be de-duplicated at all by the first node or whether the raw data will simply be transmitted to the second node or some other node. This facilitates a self-aware CDDD topology efficiently and intelligently utilizing bandwidth and processing power. For example, a link between two nodes may have a large amount of unused bandwidth. Raw data may reside at one node that has limited processing power and limited storage while another node reachable through the link having the large amount of bandwidth may have more suitable processing power and storage. Thus, the RCPkt may return information that controls where the raw data is transmitted to for de-duplication and where the de-duplication occurs.

The RCPkt may also include information identifying a desired de-duplication time for the raw data. Times to de-duplicate include in-line, near-line, off-line, and other times. The second node may have information about how pressing the need is to de-duplicate the raw data at the first node. Thus the RCPkt may provide information that accelerates or postpones when de-duplication will occur.

The RCPkt may also include information identifying a desired rule for de-duplicating the raw data. Different nodes may have different de-duplication rules and thus the RCPkt may provide suggestions concerning appropriate rules that both nodes can apply.

The RCPkt may also provide information identifying a desired chunk size for chunking the raw data. The second node(s) may indicate that hashes should be provided for larger or smaller chunks. The second node(s) may also indicate that raw data should be sent in different sized chunks. Thus, the RCPkt may include control information based on decisions made at the second node(s).

Rather than providing control information that commands, for example, that the first node send hashes for smaller chunks, the second node may send statistics acquired from processing data in the DNPkt. The statistics may concern, for example, the number of hashes in the DNPkt that were matched on the second node, the number of hashes in the DNPkt that were matched in a row on the second node, and other statistics. In this example, decisions concerning reconfiguration may be made solely or primarily by the first node.

In another example, the RCPkt may include a request from the second node for a subsequent DNPkt. The second node may not have been able to make conclusive determinations based on processing the first DNPkt and thus may ask the first node to either provide another DNPkt configured the same as a previous DNPkt or to provide a DNPkt produced under different constraints.

At 150, method 100 includes selectively reconfiguring the parameterized reactive agent by modifying the set of parameters in response to information in the RCPkt. This reconfiguring can include changing chunk size, changing from transmitting raw data to hashes, changing from transmitting hashes to transmitting raw data, and other changes.

Figure 2:
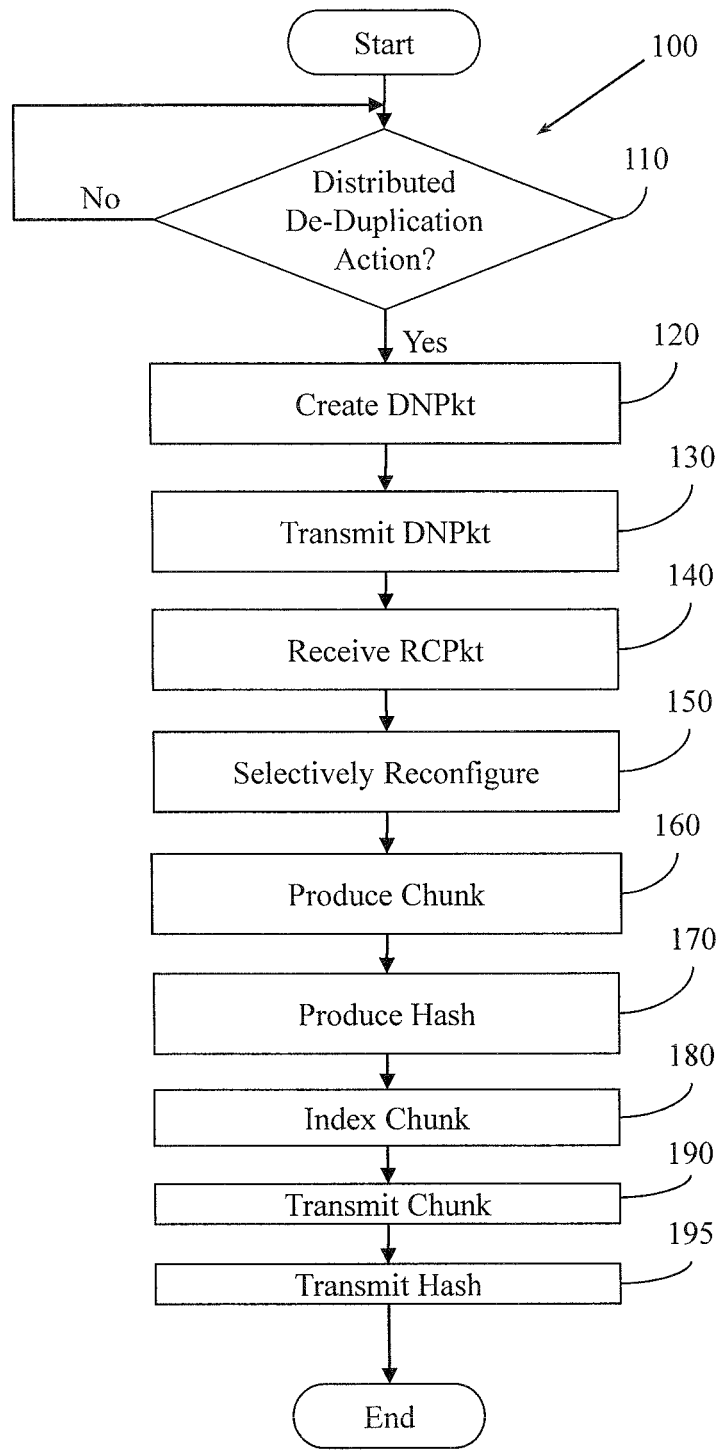
FIG. 2 illustrates an embodiment of a method associated with collaborative distributed data de-duplication.

FIG. 2 illustrates another embodiment of method 100. This embodiment of method 100 includes the actions 110-150. This embodiment of method 100 also includes other actions that are controlled, at least in part, on the current values of members of the set of parameters. For example, this embodiment of method 100 includes, at 160, selectively producing a chunk of raw data. The size of the chunk and how the chunk boundaries were decided may depend on the parameters.

This embodiment of method 100 also includes, at 170, producing the hash of the chunk of raw data. Once again, the width and strength of the hash may depend on the parameters. Also, the number and types of hashes produced for a chunk may depend on the parameters.

This embodiment of method 100 also includes, at 180, indexing the chunk based on the hash. Whether the indexing is performed solely in a master index, solely in a temporal index, in a mixture of master and temporal indexes, solely on a first apparatus, solely on a second apparatus, on a combination of apparatuses, or in other ways may depend on the parameters.

This embodiment of method 100 also includes, at 190, transmitting the chunk to the second node, and, at 195, transmitting the hash to the second node.

Figure 3:
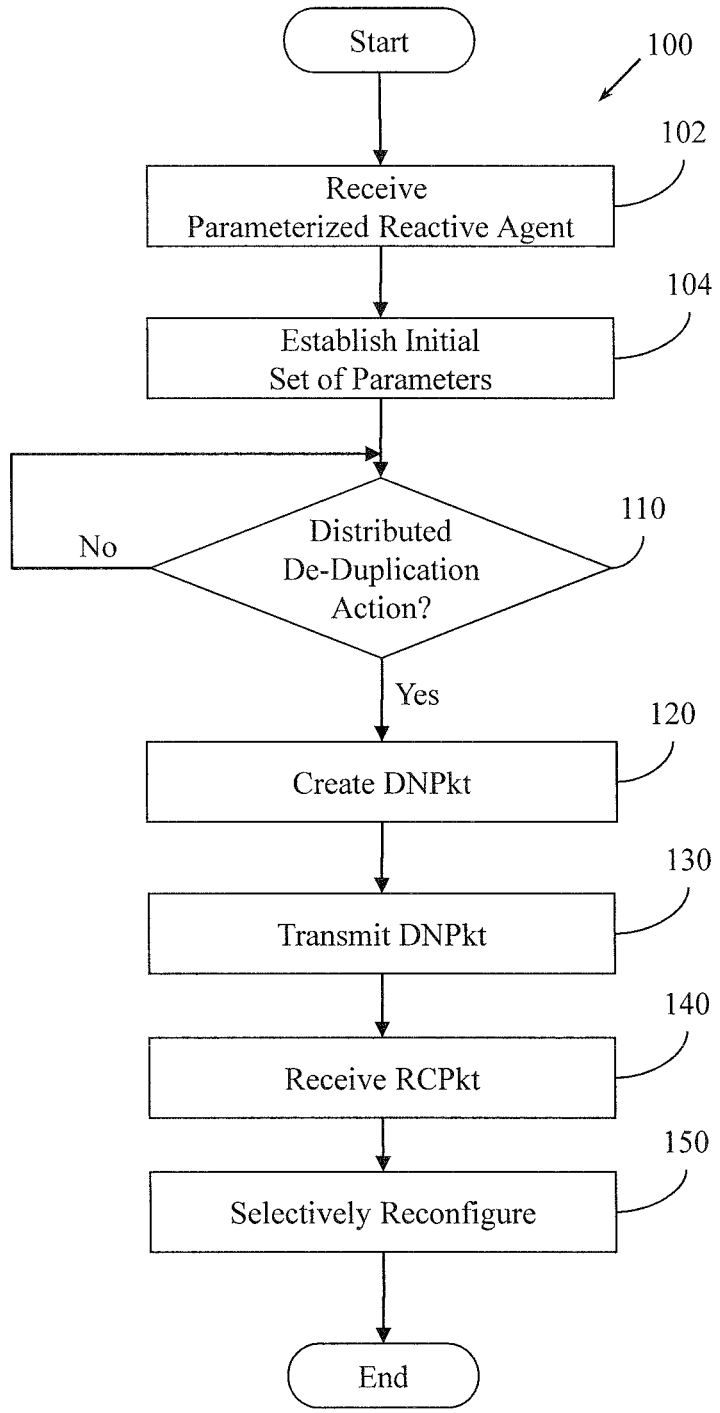
FIG. 3 illustrates an embodiment of a method associated with collaborative distributed data de-duplication.

FIG. 3 illustrates another embodiment of method 100. In addition to actions 110-150 of the embodiment illustrated in FIG. 1, this embodiment of method 100 also includes, at 102, receiving the parameterized reactive agent at the first node. The parameterized reactive agent may be received from a control computer or from another node participating in the CDDD, among other locations. This embodiment also includes, at 104, establishing the set of parameters in the first node. The initial set of parameters may be, for example, a default set of parameters, a set of parameters acquired from the provider of the parameterized agent, random parameters, parameters acquired from another node in the CDDD topology, or other parameters.

In one example, a method may be implemented as computer executable instructions. Thus, in one example, a computer readable medium may store computer executable instructions that if executed by a computer (e.g., data reduction server) cause the computer to perform method 100. While executable instructions associated with method 100 are described as being stored on a computer readable medium, it is to be appreciated that executable instructions associated with other example methods described herein may also be stored on a computer readable medium.

"Computer readable medium", as used herein, refers to a medium that stores signals, instructions and/or data. A computer readable medium may take forms, including, but not limited to, non-volatile media, and volatile media. Non-volatile media may include, for example, optical disks, and magnetic disks. Volatile media may include, for example, semiconductor memories, and dynamic memory. Common forms of a computer readable medium may include, but are not limited to, a floppy disk, a flexible disk, a hard disk, a magnetic tape, other magnetic medium, an ASIC, a CD (compact disk), other optical medium, a RAM (random access memory), a ROM (read only memory), a memory chip or card, a memory stick, and other media from which a computer, a processor, or other electronic device can read.

Figure 4:
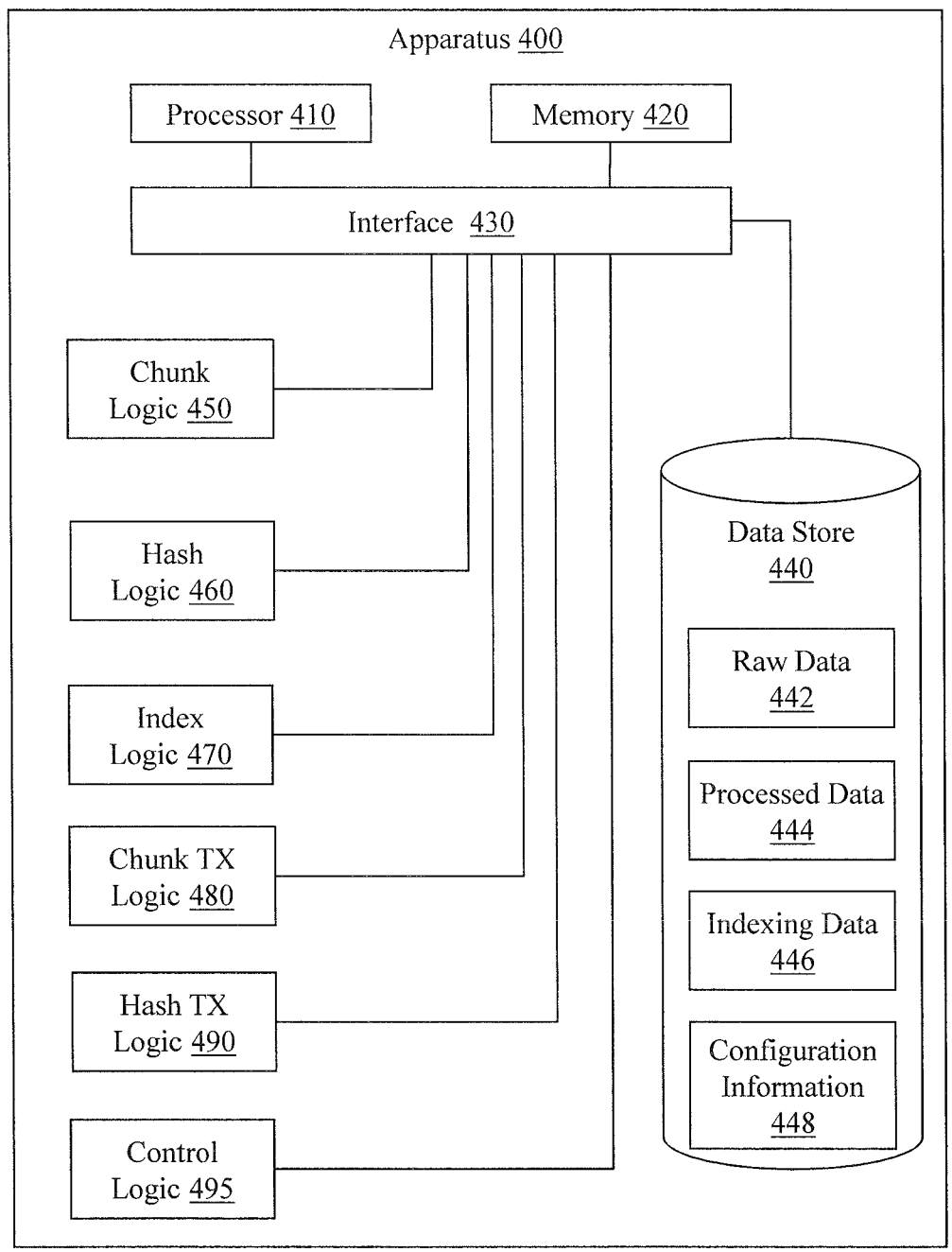
FIG. 4 illustrates an embodiment of an apparatus associated with collaborative distributed data de-duplication.

FIG. 4 illustrates an apparatus 400. Apparatus 400 includes a data store 440. Data store 440 may store raw data 442. The raw data 442 may be de-duplicated as part of a collaborative, distributed process involving two or more apparatus. The process may occur completely or partially on apparatus 400 or completely or partially on a different collaborating apparatus. The data store 440 may also store processed data 444. The processed data 444 may have been de-duplicated as part of the collaborative, distributed process. The processed data 444 may have been de-duplicated on apparatus 400 or on another apparatus or apparatuses. The data store 440 may also store indexing data 446 for identifying and retrieving the processed data. The indexing data 446 may also have been produced in whole or in part on apparatus 400 or in whole or in part on another apparatus in the CDDD. The data store 440 may also store configuration information 448. The configuration information 448 may control how the apparatus 400 performs its portion of the collaborative, distributed process. For example, the configuration information 448 may control how the raw data 442 is chunked, hashed, and transmitted. The configuration information 448 may also control when and whether the raw data 442 and/or hashes associated with raw data 442 are transmitted to another node in the CDDD topology. The configuration information 448 may also control when and whether the processed data 444 and/or indexing data 446 is transmitted to another node in the CDDD topology.

Apparatus 400 also includes a processor 410, a memory 420, and an interface 430. The interface 430 connects the processor 410, the memory 420, the data store 440, and a set of logics.

The set of logics may include a chunk logic 450. Chunk logic 450 may be configured to participate in the collaborative, distributed process by creating a chunk of data from the raw data 442. The chunk of data is a subset of the raw data 442. In one example, the chunk logic 450 selectively produces chunks of different sizes using different chunking criteria based on control information provided by the control logic 495. The control logic 495 may decide on chunking criteria based on the configuration information 448 and feedback data received from another node in the CDDD topology.

The set of logics may also include a hash logic 460. The hash logic 460 may be configured to participate in the collaborative, distributed process by computing a hash for the chunk of data. In one example, the hash logic 460 selectively produces different types of hashes based on control information provided by the control logic 495. Once again, the control logic 495 may make hash type, width, and number decisions based on the configuration information 448 and on feedback data received from another apparatus in the CDDD topology.

The set of logics may also include an index logic 470. The index logic 470 may be configured to participate in the collaborative, distributed process by selectively storing the chunk of data in the data store 440 and by manipulating the indexing data 446 based, at least in part, on the hash. In one example, the index logic 470 is configured to control a second apparatus in the CDDD topology to store one or more of, a chunk, and a hash on a data store associated with the second apparatus. In another example, the index logic 470 is configured to store a chunk and/or a hash in the data store 440. In yet another example, the index logic 470 is configured to control apparatus 400 and another apparatus in the CDDD topology to co-operate in storing chunks and hashes.

The set of logics may also include a chunk transmission logic 480 that is configured to transmit the chunk to a second apparatus involved in the collaborative, distributed process. The set of logics may also include a hash transmission logic 490 that is configured to transmit the hash to the second apparatus. The chunk transmission logic 480 and the hash transmission logic 490 may be configured to produce a de-duplication negotiation packet that identifies how the control logic 495 is configured. The identification may be made based on the results produced by the chunk logic 450 and the hash logic 460. By way of illustration, the configuration of the control logic 495 may be determined by the size of chunks produced by the chunk logic 450 and how chunk boundaries were selected. The chunk transmission logic 480 and the hash transmission logic 490 may be configured to provide the de-duplication negotiation packet to a second apparatus as a solicitation for feedback data.

In different examples, a de-duplication negotiation packet can include a chunk(s) produced by the chunk logic 450, a related hash(es) produced by the hash logic 460, and context data associated with the raw data to be de-duplicated 442. The context data may provide information about aspects of the raw data 442 including a file type associated with the raw data 442, whether the raw data 442 has been previously de-duplicated, a source associated with the raw data 442, a destination associated with the raw data 442, whether the raw data 442 or the processed data 444 is associated with a replication event, whether the raw data 442 or the processed data 444 is associated with a rule for parsing data, and whether the raw data 442 or the processed data 444 is associated with configuring a layered parser.

The set of logics may also include a control logic 495. Control logic 495 may be configured to control the chunk logic 450, the hash logic 460, the index logic 470, the chunk transmission logic 480, and the hash transmission logic 490 based on the configuration information 448 and on feedback data from the second apparatus. The feedback data may be provided in response to the de-duplication negotiation packet provided by apparatus 400. Therefore, the feedback data may include information identifying additional nodes to participate in the collaborative, distributed process, information identifying when the raw data 442 is to be de-duplicated, and information identifying how the raw data 442 is to be de-duplicated.

Figure 5:
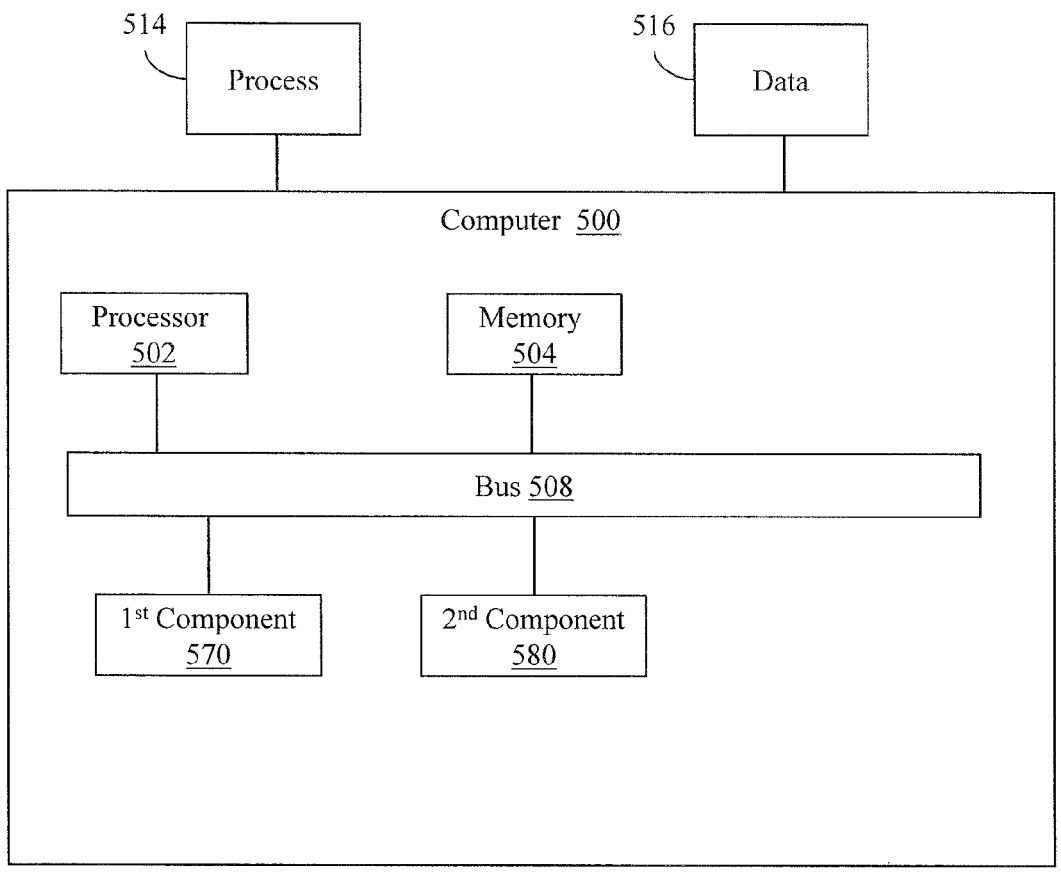
FIG. 5 illustrates a computer configured to participate in collaborative distributed data de-duplication.

FIG. 5 illustrates a computer 500. Computer 500 includes a processor 502 and a memory 504 that are operably connected by a bus 508. In one example, the computer 500 may include a first component 570 configured to initialize a layered parser in a first node in a collaborative distributed data de-duplication topology with a first set of de-duplication control parameters. The parameters can control how the layered parser will chunk, hash, and index data. The parameters can also control how the layered parser will transmit raw data, chunks, and hashes, among other things. The first component 570 can therefore implement a portion of method 100 described above or method 600 described below. Computer 500 can also include a second component 580 that is configured to selectively reconfigure the layered parser in response to feedback acquired from a second node in the collaborative distributed data de-duplication topology. The feedback will concern data (e.g., raw data, chunks, hashes, negotiation packets) provided to the second node from the layered parser in the first node. The first component 570 and the second component 580 may be, for example, ASICs inserted into computer 500. While two separate components are illustrated, one skilled in the art will appreciate that a greater and/or lesser number of components could be present in computer 500 and tasked with performing method 100 and/or method 600.

Generally describing an example configuration of the computer 500, the processor 502 may be a variety of various processors including dual microprocessor and other multi-processor architectures. A memory 504 may include volatile memory (e.g., RAM (random access memory)) and/or non-volatile memory (e.g., ROM (read only memory)). The memory 504 can store a process 514 and/or a data 516, for example. The process 514 may be a data de-duplication process and the data 516 may be an object to be de-duplicated.

The bus 508 may be a single internal bus interconnect architecture and/or other bus or mesh architectures. While a single bus is illustrated, it is to be appreciated that the computer 500 may communicate with various devices, logics, and peripherals using other busses (e.g., PCIE (peripheral component interconnect express), 1394, USB (universal serial bus), Ethernet). The bus 508 can be types including, for example, a memory bus, a memory controller, a peripheral bus, an external bus, a crossbar switch, and/or a local bus.

Figure 6:
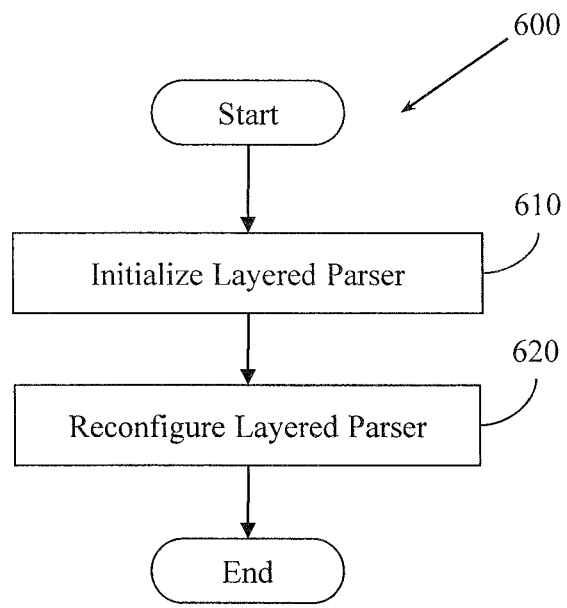
FIG. 6 illustrates an embodiment of a method associated with collaborative distributed data de-duplication.

FIG. 6 illustrates a method 600 associated with collaborative, distributed data de-duplication. Method 600 may be performed by a computer participating in a collaborative, distributed data de-duplication topology. Method 600 includes, at 610, initializing a layered parser in a first node in a collaborative distributed data de-duplication topology with a first set of de-duplication control parameters. The parameters can control, for example, how the layered parser will chunk, hash, and index data. The parameters can also control, for example, how the layered parser will transmit raw data, chunks, and hashes, among other things.

Method 600 also includes, at 620, selectively reconfiguring the layered parser in response to feedback acquired from a second node in the collaborative distributed data de-duplication topology. The feedback will identify, for example, whether the second node would like to receive raw data, hashes associated with smaller chunks, hashes associated with larger chunks, or nothing at all. The second node may decide that it wants nothing at all upon determining that it is likely that the second node already has the entire set of raw data that the first node is trying to communicate to the second node.

While example apparatus, methods, and articles of manufacture have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the twin "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A method, comprising:
upon determining that a first node configured with a parameterized reactive agent is going to participate in a collaborative, distributed data de-duplication operation in a collaborative, distributed, data de-duplication (CDDD) topology,
controlling the first node, in accordance with a set of parameters associated with the parameterized reactive agent, to create a de-duplication negotiation packet (DNPkt) associated with processing raw data available to the first node;
controlling the first node to transmit the DNPkt to a second node in the CDDD topology;
receiving, from the second node, a reactive control packet (RCPkt) responsive to the DNPkt; and
selectively reconfiguring the parameterized reactive agent by modifying the set of parameters in response to information in the RCPkt.

2. The method of claim 1, where the parameterized reactive agent is configured to control the first node to perform, in accordance with the set of parameters:
selectively producing a chunk of raw data from the raw data available at the first node,
selectively producing a hash of the chunk of raw data,
selectively indexing the chunk based on the hash,
selectively transmitting the chunk to the second node, and
selectively transmitting the hash to the second node.

3. The method of claim 2, comprising:
controlling the parameterized reactive agent to control the first node to perform, in accordance with the set of parameters:
selectively producing the chunk of raw data,
selectively producing the hash of the chunk of raw data,
selectively indexing the chunk based on the hash,
selectively transmitting the chunk to the second node, and
selectively transmitting the hash to the second node.

4. The method of claim 1, comprising:
receiving the parameterized reactive agent at the first node.

5. The method of claim 4, comprising:
establishing an initial set of parameters for a newly received parameterized reactive agent in the first node.

6. The method of claim 1, where the DNPkt comprises:
a portion of the raw data;
a hash of the portion of the raw data; and
context data associated with the raw data.

7. The method of claim 6, where the DNPkt comprises:
two or more different portions of the raw data, where the two or more different portions have different lengths; and
hashes associated with the two or more different portions.

8. The method of claim 6, where the context data identifies one or more of, a file type associated with the raw data, whether the raw data has been previously de-duplicated, a source associated with the raw data, a destination associated with the raw data, whether the data is associated with a replication event, whether the raw data is associated with a rule for parsing data, and whether the raw data is associated with configuring a layered parser.

9. The method of claim 8, where the set of parameters are determined based, at least in part, on the context data.

10. The method of claim 8, where the composition of the DNPkt is determined, at least in part, by the context data.

11. The method of claim 1, where the RCPkt includes one or more of:
information identifying a desired de-duplication node for the raw data;
information identifying a desired de-duplication time for the raw data;
information identifying a desired rule for de-duplicating the raw data;
information identifying a desired chunk size for chunking the raw data;
a statistic from processing data in the DNPkt; and
a request from the second node for a subsequent DNPkt.

12. The method of claim 1, where determining that the first node is going to participate in the collaborative, distributed, data de-duplication operation is performed on-the-fly, just-in-time, during collaborative de-duplication actions involving two or more nodes in the CDDD topology.

13. An apparatus, comprising:
a data store to store:
raw data to be de-duplicated as part of a collaborative, distributed process involving two or more apparatus;
processed data de-duplicated as part of the collaborative, distributed process;
indexing data for identifying and retrieving the processed data; and
configuration information for controlling how the apparatus performs its portion of the collaborative, distributed process;
a processor;
a memory; and
an interface to connect the processor, the memory, and a set of logics, the set of logics comprising:
a chunk logic configured to participate in the collaborative, distributed process by creating a chunk of data from the raw data, where the chunk of data is a subset of the raw data;
a hash logic configured to participate in the collaborative, distributed process by computing a hash for the chunk of data;
an index logic configured to participate in the collaborative, distributed process by selectively storing the chunk of data in the data store and by manipulating the indexing data based, at least in part, on the hash;
a chunk transmission logic configured to transmit the chunk to a second apparatus involved in the collaborative, distributed process;
a hash transmission logic configured to transmit the hash to the second apparatus; and
a control logic configured to control the chunk logic, the hash logic, the index logic, the chunk transmission logic, and the hash transmission logic based on the configuration information and on feedback data from the second apparatus.

14. The apparatus of claim 13, where the chunk logic selectively produces chunks of different sizes using different chunking criteria based on control information provided by the control logic as determined by the configuration information and the feedback data.

15. The apparatus of claim 13, where the hash logic selectively produces different types of hashes based on control information provided by the control logic as determined by the configuration information and the feedback data.

16. The apparatus of claim 13, where the index logic is configured to control the second apparatus to store one or more of, the chunk, and the hash on a data store associated with the second apparatus.

17. The apparatus of claim 13, where the chunk transmission logic and the hash transmission logic are configured to produce a de-duplication negotiation packet that identifies how the control logic is configured based on the results produced by the chunk logic and the hash logic and to provide the de-duplication negotiation packet to the second apparatus as a solicitation for the feedback data.

18. The apparatus of claim 13, where the de-duplication negotiation packet comprises:
one or more chunks produced by the chunk logic;
one or more related hashes produced by the hash logic; and
context data associated with the raw data to be de-duplicated,
where the context data identifies one or more of, a file type associated with the raw data, whether the raw data has been previously de-duplicated, a source associated with the raw data, a destination associated with the raw data, whether the data is associated with a replication event, whether the raw data is associated with a rule for parsing data, and whether the raw data is associated with configuring a layered parser.

19. The apparatus of claim 13, where the feedback data comprises:
information identifying additional nodes to participate in the collaborative, distributed process;
information identifying when the raw data is to be de-duplicated; and
information identifying how the raw data is to be de-duplicated.

* * * * *

UNITED STATES PATENT AND TRADEMARK OFFICE
CERTIFICATE OF CORRECTION

| | | |
|---|---|---|
| PATENT NO. | : 8,543,551 B2 | Page 1 of 1 |
| APPLICATION NO. | : 13/182498 | |
| DATED | : September 24, 2013 | |
| INVENTOR(S) | : Tofano | |

It is certified that error appears in the above-identified patent and that said Letters Patent is hereby corrected as shown below:

In the Specification

Detailed Description of Invention:

In column 9, line 2 delete "then the twin" and insert --then the term--.

Signed and Sealed this
Twentieth Day of May, 2014

Michelle K. Lee
*Deputy Director of the United States Patent and Trademark Office*